(12) United States Patent
Piper

(10) Patent No.: US 9,564,382 B2
(45) Date of Patent: Feb. 7, 2017

(54) TEST STRUCTURE FOR DETERMINING OVERLAY ACCURACY IN SEMICONDUCTOR DEVICES USING RESISTANCE MEASUREMENT

(71) Applicant: WaferTech, LLC, Camas, WA (US)

(72) Inventor: Daniel Piper, Vancouver, WA (US)

(73) Assignee: WAFERTECH, LLC, Camas, WA (US)

( * ) Notice: Subject to any disclaimer, the term of this patent is extended or adjusted under 35 U.S.C. 154(b) by 0 days.

(21) Appl. No.: 14/991,780

(22) Filed: Jan. 8, 2016

(65) Prior Publication Data
US 2016/0126152 A1    May 5, 2016

Related U.S. Application Data

(62) Division of application No. 13/215,908, filed on Aug. 23, 2011, now Pat. No. 9,252,202.

(51) Int. Cl.
*H01L 21/66* (2006.01)
*H01L 49/02* (2006.01)
*G01R 31/00* (2006.01)

(52) U.S. Cl.
CPC ............. *H01L 22/34* (2013.01); *H01L 22/14* (2013.01); *H01L 28/24* (2013.01)

(58) Field of Classification Search
CPC ......... H01L 22/30–22/34; H01L 22/00–22/14; H01L 21/66; H03M 1/205; H03M 1/632; H03M 1/635; G01R 31/00
See application file for complete search history.

(56) References Cited

U.S. PATENT DOCUMENTS

| | | | | |
|---|---|---|---|---|
| 3,922,707 A | * | 11/1975 | Freed ................. | G01R 31/2884 148/DIG. 136 |
| 3,974,443 A | * | 8/1976 | Thomas ............. | G01R 31/2853 324/716 |
| 4,347,479 A | * | 8/1982 | Cullet ................ | G01R 31/2884 257/E21.53 |
| 4,399,205 A | * | 8/1983 | Bergendahl ......... | G03F 7/70633 257/E21.53 |
| 4,516,071 A | * | 5/1985 | Buehler .............. | G01R 31/275 324/716 |
| 4,538,105 A | * | 8/1985 | Ausschnitt .......... | G03F 7/70633 324/716 |
| 4,835,466 A | * | 5/1989 | Maly .................... | G01R 31/024 324/537 |

(Continued)

*Primary Examiner* — William F Kraig
*Assistant Examiner* — Maliheh Malek
(74) *Attorney, Agent, or Firm* — Duane Morris LLP

(57) ABSTRACT

Provided is a test pattern structure for determining overlay accuracy in a semiconductor device. The test pattern structure includes one or more resistor structures formed by patterning a lower silicon layer. Each includes a zigzag portion with leads at different spatial locations. An upper pattern is formed and includes at least one pattern feature formed over the resistor or resistors. The portions of the resistor or resistors not covered by the upper pattern feature will become silicided during a subsequent silicidation process. Resistance is measured to determine overlay accuracy as the resistor structures are configured such that the resistance of the resistor structure is determined by the degree of silicidation of the resistor structure which is determined by the overlay accuracy between the upper and lower patterns.

16 Claims, 5 Drawing Sheets

(56) References Cited

U.S. PATENT DOCUMENTS

| | | | | |
|---|---|---|---|---|
| 4,896,108 A * | 1/1990 | Lynch | G01R 27/14 | 324/713 |
| 5,239,191 A * | 8/1993 | Sakumoto | H01L 22/32 | 257/203 |
| 5,436,097 A * | 7/1995 | Norishima | G03F 7/706 | 257/E21.53 |
| 5,485,095 A * | 1/1996 | Bertsch | G01R 31/2884 | 324/525 |
| 5,552,718 A * | 9/1996 | Bruce | G01R 31/26 | 324/699 |
| 5,654,588 A * | 8/1997 | Dasse | G01R 31/2831 | 257/204 |
| 5,670,891 A * | 9/1997 | Ling | H01L 22/34 | 324/716 |
| 5,717,559 A * | 2/1998 | Narita | H01L 27/0255 | 361/111 |
| 5,757,507 A * | 5/1998 | Ausschnitt | G03F 7/70633 | 250/548 |
| 5,821,765 A * | 10/1998 | Ling | H01L 22/34 | 324/537 |
| 5,889,410 A * | 3/1999 | El-Kareh | H01L 22/34 | 257/48 |
| 5,956,566 A * | 9/1999 | Lin | H01L 22/34 | 257/48 |
| 6,001,663 A * | 12/1999 | Ling | H01L 22/34 | 438/14 |
| 6,080,597 A * | 6/2000 | Moon | H01L 22/34 | 257/48 |
| 6,083,785 A * | 7/2000 | Segawa | H01L 27/0629 | 257/E21.008 |
| 6,087,189 A * | 7/2000 | Huang | H01L 22/34 | 438/10 |
| 6,165,807 A * | 12/2000 | Lee | H01L 22/34 | 438/14 |
| 6,288,453 B1 * | 9/2001 | Chan | H01L 22/34 | 257/797 |
| 6,288,556 B1 * | 9/2001 | Sato | G03F 7/70633 | 324/713 |
| 6,297,644 B1 * | 10/2001 | Jarvis | G01R 31/306 | 324/537 |
| 6,359,458 B1 * | 3/2002 | Yoshii | G01R 31/2829 | 324/762.01 |
| 6,380,554 B1 * | 4/2002 | Bush | G03F 7/70633 | 257/48 |
| 6,393,714 B1 * | 5/2002 | Look | G03F 7/70633 | 324/691 |
| 6,399,400 B1 * | 6/2002 | Osann, Jr. | H01L 22/20 | 257/E21.525 |
| 6,521,910 B1 * | 2/2003 | Lin | H01L 22/34 | 257/48 |
| 6,559,475 B1 * | 5/2003 | Kim | H01L 22/34 | 257/48 |
| 6,570,243 B1 * | 5/2003 | Hagihara | H01L 22/34 | 257/620 |
| 6,623,995 B1 * | 9/2003 | Chen | H01L 22/34 | 257/48 |
| 6,680,484 B1 * | 1/2004 | Young | H01L 22/34 | 257/48 |
| 6,696,849 B2 * | 2/2004 | Ban | G01R 31/2831 | 324/750.05 |
| 6,806,107 B1 * | 10/2004 | Wu | H01L 22/34 | 257/48 |
| 6,897,476 B1 * | 5/2005 | Kim | G01K 7/00 | 257/48 |
| 6,984,531 B2 * | 1/2006 | Rumsey | G03F 7/70658 | 438/11 |
| 7,157,927 B2 * | 1/2007 | Okajima | H01L 22/34 | 257/48 |
| 7,550,303 B2 * | 6/2009 | Argondona | H01L 22/34 | 438/18 |
| 7,741,133 B2 * | 6/2010 | Lee | G01R 31/06 | 324/112 |
| 7,808,643 B2 * | 10/2010 | Smith | G03F 7/705 | 356/445 |
| 8,258,806 B2 * | 9/2012 | Liu | G01R 31/2884 | 324/762.02 |
| 8,546,250 B2 * | 10/2013 | Piper | H01L 27/0688 | 257/E21.614 |
| 2004/0072398 A1 * | 4/2004 | Look | H01L 22/34 | 438/200 |
| 2004/0155316 A1 * | 8/2004 | Saito | H01L 22/34 | 257/536 |
| 2004/0188678 A1 * | 9/2004 | Wieczorek | H01L 22/34 | 257/48 |
| 2004/0262604 A1 * | 12/2004 | Lee | H01L 22/34 | 257/48 |
| 2005/0140534 A1 * | 6/2005 | Nishi | G09G 3/3688 | 341/154 |
| 2006/0024853 A1 * | 2/2006 | Ahsan | H01L 22/34 | 438/18 |
| 2006/0063317 A1 * | 3/2006 | Donze | H01L 22/34 | 438/176 |
| 2006/0071284 A1 * | 4/2006 | Tai | H01L 22/34 | 257/379 |
| 2006/0079086 A1 * | 4/2006 | Boit | H01J 37/228 | 438/662 |
| 2007/0063317 A1 * | 3/2007 | Kim | G03F 7/70633 | 257/622 |
| 2007/0296439 A1 * | 12/2007 | Feustel | H01L 22/34 | 324/754.03 |
| 2008/0048272 A1 * | 2/2008 | Hong | H01L 21/28052 | 257/401 |
| 2008/0169514 A1 * | 7/2008 | Hsueh | H01L 23/5228 | 257/379 |
| 2009/0085716 A1 * | 4/2009 | Kim | H01C 1/14 | 338/325 |
| 2009/0102069 A1 * | 4/2009 | Tan | G03F 1/144 | 257/797 |
| 2009/0230449 A1 * | 9/2009 | Sakaguchi | H01L 27/0688 | 257/298 |
| 2010/0022064 A1 * | 1/2010 | Hall | H01L 27/0288 | 438/382 |
| 2010/0117162 A1 * | 5/2010 | Rohrer | H01L 23/4824 | 257/401 |
| 2010/0133583 A1 * | 6/2010 | Mawatari | H01L 27/0259 | 257/173 |
| 2010/0155729 A1 * | 6/2010 | Yang | G02F 1/1345 | 257/52 |
| 2010/0193786 A1 * | 8/2010 | Kim | H01L 22/34 | 257/48 |
| 2010/0207648 A1 * | 8/2010 | Zhu | G01R 31/2884 | 324/719 |
| 2010/0213968 A1 * | 8/2010 | De Winter | H01L 22/34 | 324/750.3 |
| 2010/0253380 A1 * | 10/2010 | Martin | H01L 22/34 | 324/762.01 |
| 2010/0321705 A1 * | 12/2010 | Miyasaka | G03F 9/7076 | 356/620 |
| 2011/0233628 A1 * | 9/2011 | Parkhurst | H01L 27/0605 | 257/296 |
| 2012/0007207 A1 * | 1/2012 | Salcedo | H01L 27/0259 | 257/491 |
| 2012/0235240 A1 * | 9/2012 | Dixit | H01L 21/845 | 257/351 |
| 2013/0009663 A1 * | 1/2013 | Gauch | H01L 22/34 | 324/762.01 |
| 2013/0032863 A1 * | 2/2013 | Kawahara | H01L 28/20 | 257/272 |
| 2013/0069236 A1 * | 3/2013 | Chen | H01L 27/0207 | 257/758 |
| 2013/0234138 A1 * | 9/2013 | Lutz | H01L 22/34 | 257/48 |
| 2014/0042566 A1 * | 2/2014 | Ota | H01L 41/04 | 257/417 |

* cited by examiner

TEST STRUCTURE FOR DETERMINING OVERLAY ACCURACY IN SEMICONDUCTOR DEVICES USING RESISTANCE MEASUREMENT

RELATED APPLICATION

This application is a divisional of U.S. patent application Ser. No. 13/215,908, filed Aug. 23, 2011, the contents of which are hereby incorporated by reference, as if set forth in their entirety.

TECHNICAL FIELD

The disclosure relates to semiconductor devices, and more particularly to electrical test structures and methods for determining overlay accuracy or misalignment between patterns of different semiconductor device layers using resistance measurements.

BACKGROUND

As semiconductor devices continue to advance and become more highly integrated and as the device features become increasingly miniaturized, the alignment between one device level and another device level increases in criticality. The patterns that combine to form integrated circuit or other semiconductor devices must be accurately and precisely aligned to one another, i.e. each pattern must be properly overlaid with respect to existing patterns. Embedded flash products represent one particular example of a product that requires stringent overlay control at various levels such as the floating gate level, in order to minimize program state leakage. While such embedded flash products may be particularly sensitive to overlay accuracy, it is important to accurately align every device level of every semiconductor device with each of the previously formed device levels, so that each device level functions as intended, in conjunction with each subjacent layer.

In conventional processing, overlay accuracy is typically measured using optical metrology tools. Such optical measurements are time consuming and subject to inaccuracies due to optical metrology limitations. Since the time-consuming optical measurements are typically required to be fed back to the exposure tool, only a limited number of optical measurements are made to determine overlay accuracy, in order to minimize time delays.

It would therefore be desirable to measure the overlay of respective layers using a technique that does not include the shortcomings and limitations of optical overlay measurement and which accurately and quickly provides overlay measurements of the substrate being processed.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides a resistor structure formed of a semiconductor material in a lower layer of a semiconductor device. The resistor structure is advantageously disposed in a test portion of a substrate as part of a lower pattern that also includes active semiconductor device features in active device portions. One exemplary resistor structure includes a zigzag structure which includes orthogonal features and can alternatively be described as a step structure or a structure of interconnected fingers. The resistor structure may include a series of parallel leads having different lengths and coupled by transverse leads that extend orthogonally with respect to the parallel leads. The resistor structure may advantageously be paired with a second resistor structure that faces the first resistor structure. The second resistor structure also has parallel leads that may be parallel to the series of parallel leads of the first resistor structure and the second resistor structure may be the mirror image of the first resistor structure in one exemplary embodiment. The second resistor structure is also formed of the lower layer of semiconductor material. Each resistor structure includes transverse leads spaced different distances from the other of the resistor structures.

An upper pattern in a further material layer or layers is formed overlaying the lower pattern and includes a structure or structures over the resistor structures such that the degree of overlay accuracy can be assessed by the number of transverse leads covered by the structure or structures of the overlying pattern. A silicidation process forms a silicide only on exposed portions of the resistor structures, i.e., portions not covered by the upper pattern. Electrical measurements are made from opposed ends of the resistor structures. In particular, the resistance of each resistor structure is measured. The resistance is dependent upon the amount of the resistor structure that has been silicided. In this manner, the measured electrical resistance measurements are indicative of the degree of overlay accuracy.

In other exemplary embodiments, only one resistor structure may be used and in another exemplary embodiment a set of four resistor structures may be used to determine overlay accuracy between the lower pattern and the upper pattern in more than one direction such as the x- and y-directions. The resistor structures or sets of resistor structures may be placed at multiple locations on a substrate being processed. Each of the previous exemplary embodiments can be used to show the accuracy of overlay between the lower pattern and the upper pattern.

According to another exemplary embodiment, a zigzag or step-like structure of a resistor formed as part of a pattern of a lower semiconductor layer is used to determine overlay accuracy between two other patterns formed over the lower semiconductor layer pattern.

Figure 1:
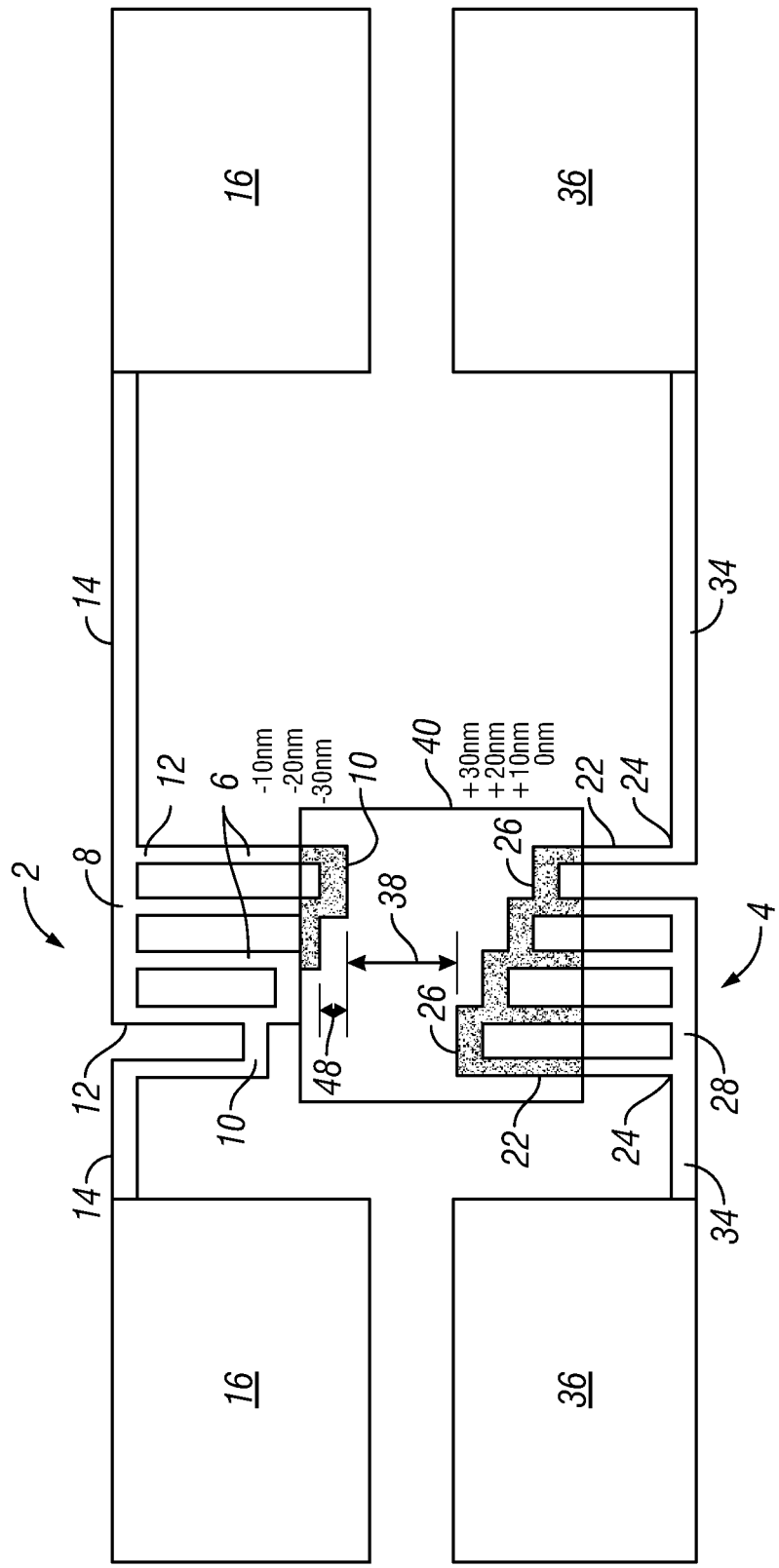
FIG. 1 is a plan view of a set of test resistor structures overlaid with a further pattern according to an aspect of the disclosure.

FIG. 1 is a plan view showing a set of complementary resistor structures formed of semiconductor materials in a lower semiconductor layer. First resistor structure 2 and second resistor structure 4 are formed of a material capable of having a silicide formed thereon, i.e. silicon. According to one exemplary embodiment, first resistor structure 2 and second resistor structure 4 may represent the active area pattern of a semiconductor device, i.e., the surface of a silicon substrate bounded by a dielectric such as a field oxide and formed during an active area or "oxide definition" patterning operation. According to other exemplary embodiments, first resistor structure 2 and second resistor structure 4 may be a polysilicon layer such as the layer used for a floating gate electrode in a floating gate flash product. Conventional or other methods may be used to pattern first resistor structure 2 and second resistor structure 4. First resistor structure 2 and second resistor structure 4 represent a part of a lower pattern formed in a lower semiconductor material. First resistor structure 2 and second resistor structure 4 are formed in a test portion on a semiconductor substrate and other portions of the lower pattern formed of the lower semiconductor material include active device structures formed in active device portions. First resistor structure 2 and second resistor structure 4 may be any suitable silicon material and are part of a pattern that includes active features formed in active portions of a semiconductor device and to which superjacent pattern features must be aligned.

First resistor structure 2 includes a series of parallel leads 6 with upper ends 12 coupled by base lead 8 in the illustrated orientation. Opposed lower ends of parallel leads 6 are coupled by transverse leads 10 which extend orthogonally from parallel leads 6. Transverse leads 10 are spaced different distances from second resistor structure 4 and couple one parallel lead 6 to an adjacent parallel lead 6. Parallel leads 6 include increasingly longer lengths going from left to right in the illustrated orientation, i.e., along one direction orthogonal to direction 38 between first resistor structure 2 and second resistor structure 4. Distance 48 between the terminal edges of adjacent transverse leads 10 may vary and may be about 10 nm in one exemplary embodiment but will vary in other exemplary embodiments. The lower portion of first resistor structure 2 as illustrated in FIG. 1 can be described as a step-structure or as a zigzag structure, but it should be understood that the illustrated embodiment is intended to be exemplary only and the number of parallel leads 6 may vary in other exemplary embodiments as will the number of transverse leads 10. The relative size and configuration of transverse leads 10 and parallel lead 6 is also exemplary only.

Second resistor structure 4 is essentially the mirror image of first resistor structure 2 in the exemplary illustrated embodiment, and includes parallel leads 22 and transverse leads 26, parallel leads 22 joined together by base lead 28 at ends 24. Parallel leads 22 include increasingly longer lengths going from right to left in the illustrated orientation.

The illustrated representation in which first resistor structure 2 and second resistor structure 4 are of the same approximate dimension and are mirror images of one another, represents an advantageous exemplary embodiment but in other exemplary embodiments, first resistor structure 2 and second resistor structure 4 may be dissimilar and include different sizes and configurations.

First resistor structure 2 is coupled to opposed contact pads 16 by way of metal leads 14. The resistance of first resistor structure 2 can be measured electrically by contacting each contact pad 16 which may be formed of metal according to various exemplary embodiments. Similarly, second resistor structure 4 is coupled to opposed contact pads 36 by way of respective metal leads 34 and the resistance of second resistor structure 4 can be measured electrically by contacting each contact pad 36 which may be formed of metal. Conventional or other techniques may be used to measure resistance.

An upper pattern is formed over the lower pattern of semiconductor material and includes upper pattern feature 40 formed over first resistor structure 2 and second resistor structure 4. Upper pattern feature 40 may represent a void in an upper material layer or layers or it may represent a discrete portion of an upper material layer or layers, and the disclosure provides for determining the overlay accuracy between upper pattern feature 40 and first and second resistor structures 2 and 4 which represents the overlay accuracy between the upper and lower patterns.

The illustrated structure showing first resistor structure 2, second resistor structure 4 and upper pattern feature 40 may be formed in a test portion of an integrated circuit chip or in a scribe line on a semiconductor substrate and this arrangement may be formed on multiple locations on the semiconductor substrate so that the overlay accuracy between the upper and lower patterns can be assessed throughout the entire semiconductor substrate. Upper pattern feature 40 represents a pattern feature formed in a test portion and is part of a device pattern formed in active device portions of the semiconductor device which act in conjunction with and are aligned with the lower semiconductor pattern. In one exemplary embodiment, the lower semiconductor pattern may be the active area definition of a semiconductor device and the upper pattern including upper pattern feature 40 may be the floating gate of a flash product and according to another exemplary embodiment, the lower semiconductor pattern may be the active area definition of a semiconductor device and the upper pattern including upper pattern feature 40 may be a polysilicon layer, an RPO layer or any other semiconductor or conductive layer. According to yet another exemplary embodiment, the lower semiconductor pattern including first resistor structure 2 and second resistor structure 4 may be the floating gate pattern and the upper pattern including upper pattern feature 40 may be a polysilicon layer used as an upper gate layer in a floating gate transistor in an embedded flash product.

Still referring to FIG. 1, the degree of overlay accuracy between upper pattern feature 40 and first and second resistor structures 2 and 4 in the y-direction is indicated by the number of transverse leads 10 and 26 that are covered by upper pattern feature 40. For example, if alignment in the y-direction was perfect, equal numbers of transverse leads would be covered by upper pattern feature 40 for each of first resistor structure 2 and second resistor structure 4, and first resistor structure 2 and second resistor structure 4 would have the same resistance after a silicidation operation.

According to one advantageous embodiment, the structure shown in FIG. 1 is formed in close proximity to another example of the structure shown in FIG. 1, but rotated 90 degrees so that overlay accuracy in both the x- and y-directions can be assessed.

Still referring to FIG. 1, the upper pattern including upper pattern feature 40 may be formed of a composite material layer including an upper layer being one of the aforementioned polysilicon layers and underlying interlevel dielectric layer. According to this exemplary embodiment, the polysilicon portion of the upper pattern is electrically isolated from the semiconductor material of first and second resistor structures 2 and 4. After the exemplary pattern is formed as shown in FIG. 1, silicidation takes place. Conventional or other silicidation techniques may be used, such as forming a metal layer over the entire semiconductor substrate being processed then heating to form a silicide on exposed surfaces such as the exposed surfaces of first resistor structure 2 and second resistor structure 4 not covered by upper pattern feature 40. The extent of silicidation of first resistor structure 2 and second resistor structure 4 will determine its resistance.

The resistance of first resistor structure 2 and second resistor structure 4 is extremely sensitive to the amount of the structure which has undergone silicidation. According to one exemplary embodiment, the sheet resistance of unsilicided polysilicon may be about 200 ohms/sq. whereas the sheet resistance of polysilicide may be about 4 ohms/sq. Such is exemplary only but this is indicative of the sensitivity of the resistor structures to the amount of the resistor structure that has undergone silicidation.

Figure 2:
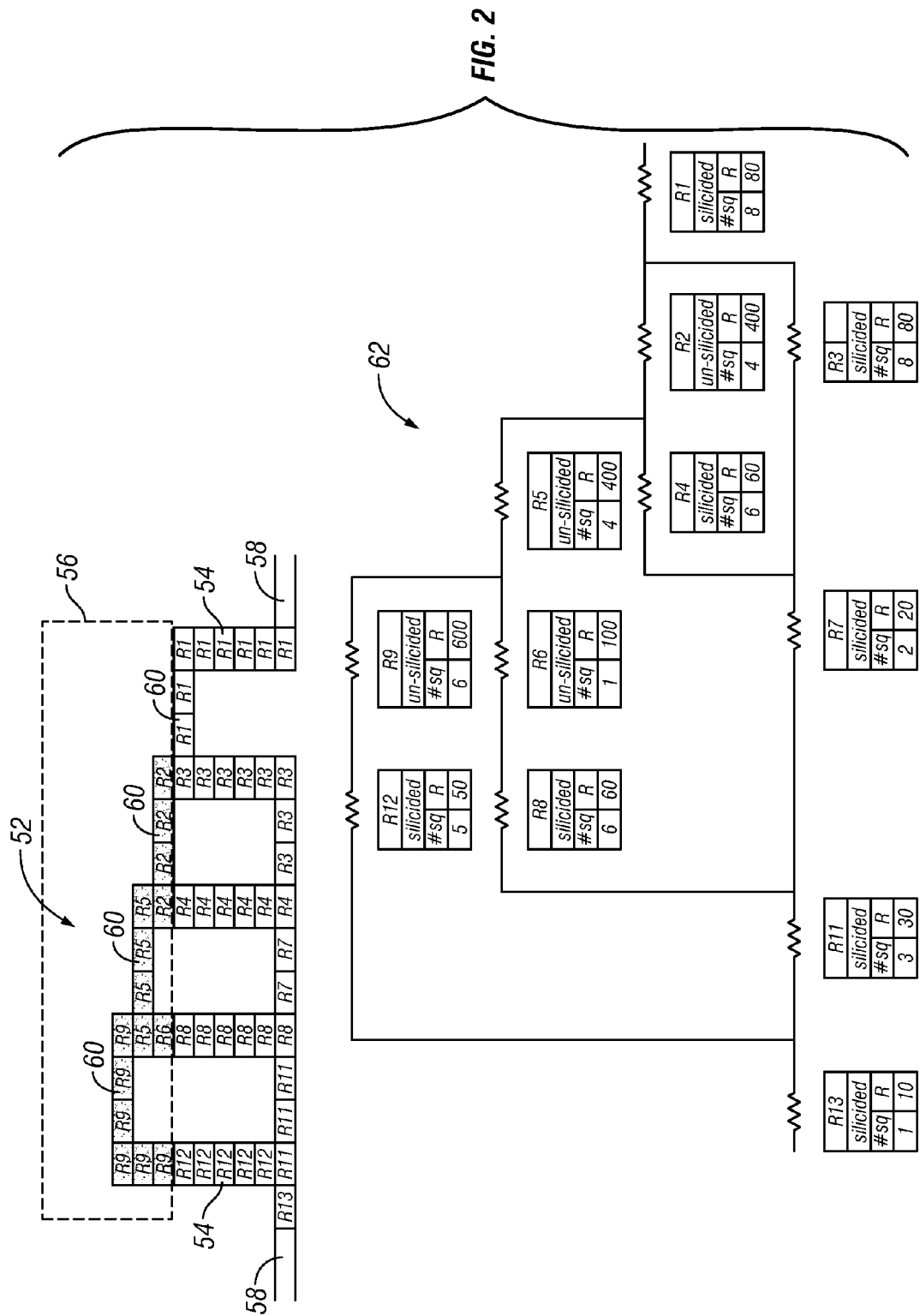
FIG. 2 is a plan view showing an exemplary underlying resistor structure with a portion silicided, and an associated resistance circuit diagram.
Figure 3:
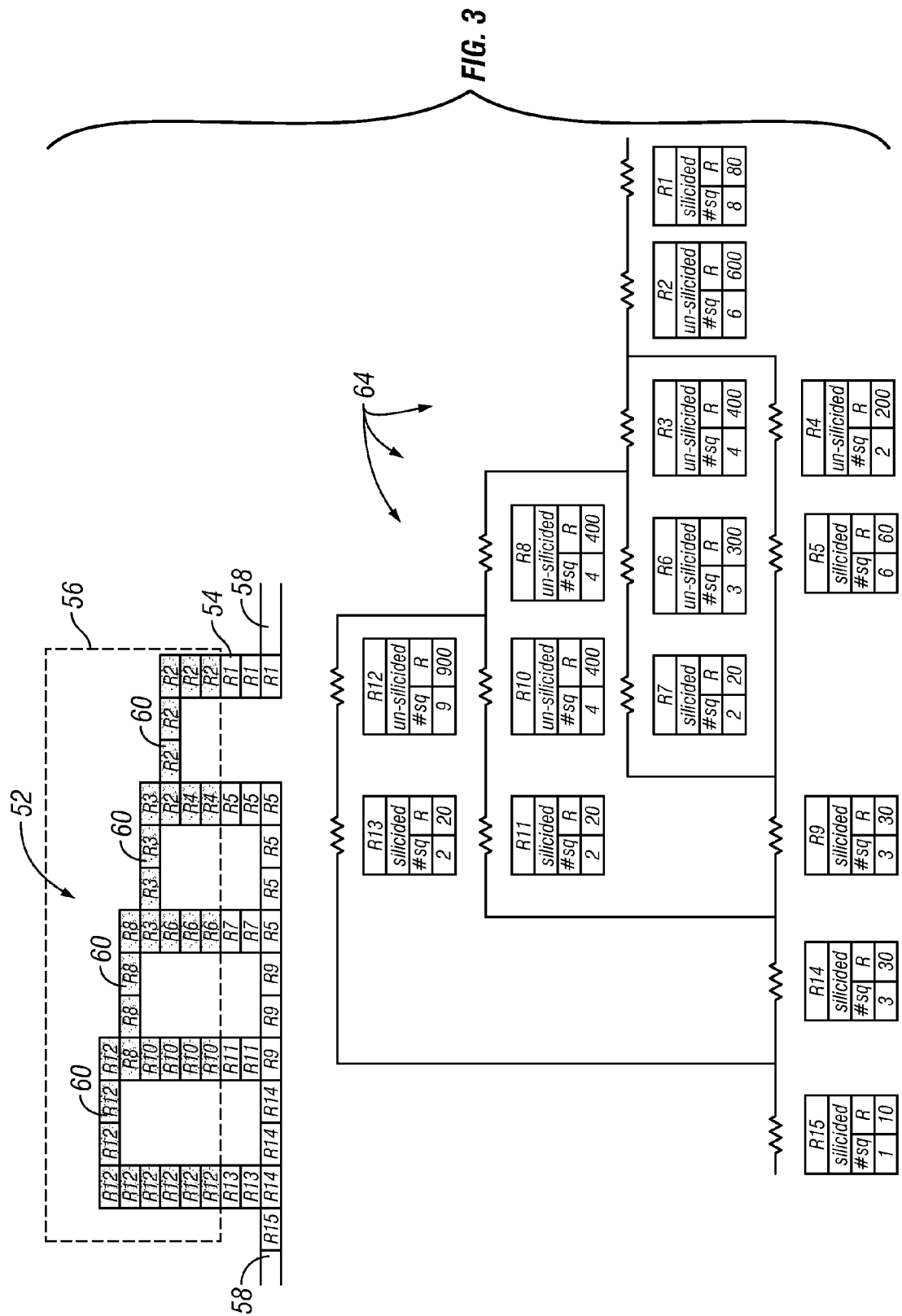
FIG. 3 is a plan view showing the same exemplary underlying resistor structure as in FIG. 2, but having a lesser portion silicided, and the associated resistance circuit diagram.

FIGS. 2 and 3 each show a top view of a partially silicided resistor structure and the associated resistance circuit diagram. In this exemplary embodiment, resistance for unsilicided silicon is 100 ohms/sq. and resistance for silicided silicon is 10 ohms/sq. The same resistor structure 52 is shown in each of FIGS. 2 and 3 but the relative amount of silicided portion 54 and unsilicided portion 56 is different. In resistor structure 52 illustrated in FIG. 2, silicided portion 54 represents a greater portion of resistor structure 52 than in the resistor structure 52 shown in FIG. 3. In particular, more transverse leads 60 are not silicided in the resistor structure 52 of FIG. 3. As such, the associated resistance circuit diagrams 62 and 64 show that the resistance for the resistor structure 52 shown in FIG. 3 is greater than the resistance for the resistor structure 52 shown in FIG. 2. The resistance is the resistance as measured across resistor structure 52 by contacting conductive features coupled to opposed conductive leads 58 using conventional known methods.

Figure 4:
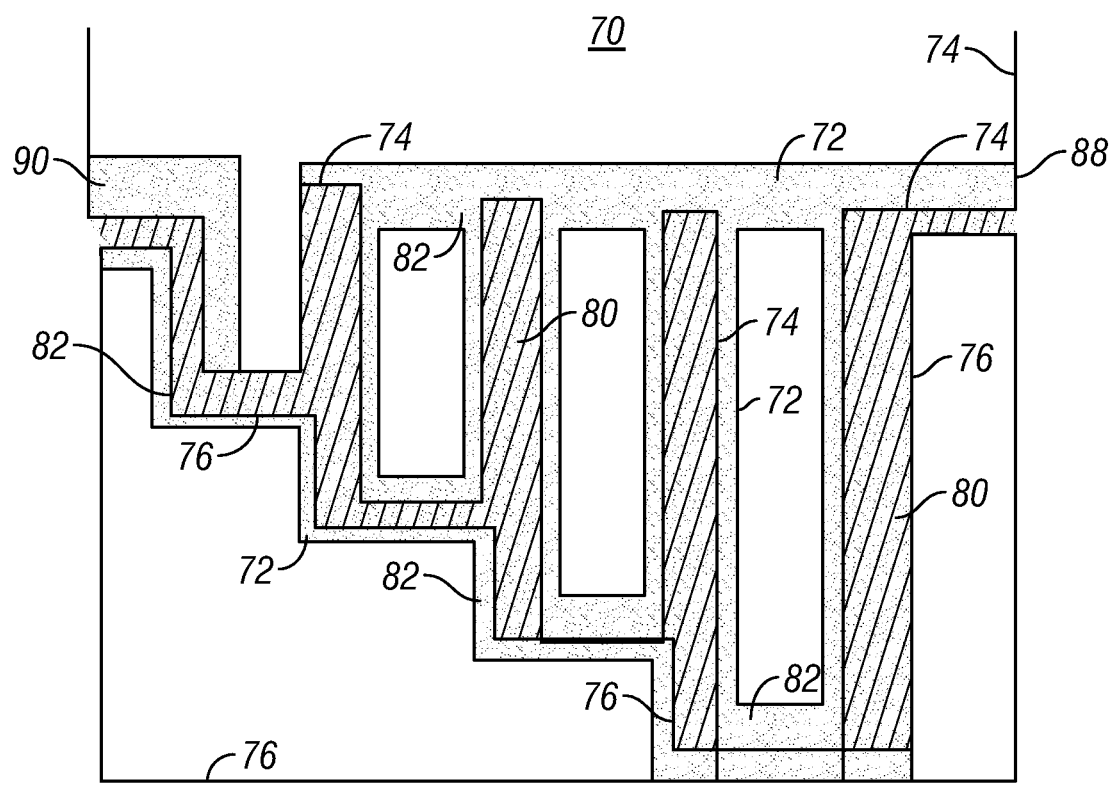
FIG. 4 is a plan view showing a resistor structure, two overlying patterns and with exposed portions of the resistor structure being silicided.

FIG. 4 illustrates another exemplary embodiment of the disclosure. Resistor structure 72 represents part of a lower pattern formed of semiconductor material and resistor structure 72 may be formed in or on semiconductor substrate 70, similar to the lower semiconductor pattern as described in conjunction with FIG. 1. Resistor structure 72 is formed of a material such as silicon that can undergo silicidation on its exposed surfaces. Resistor structure 72 represents a structure of a lower pattern formed in a test portion of a substrate, other portions of which are formed in active portions of the semiconductor device. Resistance of resistor structure 72 can be measured across opposed ends 88, 90 using various known means and the resistance of resistor structure 72 will depend upon the amount of resistor structure 72 which has undergone silicidation because the silicidation of a silicon surface reduces resistance, and due to the sensitivity of the resistance upon the amount of resistor structure 72 that has been silicided.

Upper patterns 74, 76 are each formed over resistor structure 72 and are each part of a device level that includes structures formed in active portions of the integrated circuit or other semiconductor device die. Each of upper patterns 74 and 76 may be formed of one or more material layers used in the formation of semiconductor devices. Upper pattern 74 may be formed before and beneath upper pattern 76, or vice versa. After the formation of upper patterns 74 and 76, resistor structure 72 includes two different portions: portions 82 that are covered by one or both of upper patterns 74, 76 and exposed portions 80 that are not covered by either of upper patterns 74 or 76. After a conventional silicidation process is carried out, only exposed portions 80 of resistor structure 72 are silicided. The relative amounts of covered portions 82 and exposed portions 80 will determine the resistance of resistor structure 72 as measured across ends 88 and 90.

The overlay accuracy between upper patterns 74 and 76 can be assessed by the resistance across resistor structure 72. According to one exemplary embodiment, accurate alignment between upper patterns 74 and 76 would include a gap between upper patterns 74 and 76 over resistor structure 72 such that a continuous path of silicided material is available from one end 88 to the opposed end 90 thereby producing a low resistance. The number of voids in an otherwise continuous path of silicide material from end 88 to end 90, will significantly impact resistance and is indicative of alignment between upper patterns 74 and 76. This is intended to be exemplary only and in other exemplary embodiments, resistor structure 72 and upper patterns 74 and 76 may be differently configured provided resistor structure 72 includes segments that will be exposed or covered depending on the positioning of upper patterns 74 and 76, i.e. depending on the alignment between upper patterns 74 and 76 and the alignment between upper patterns 74 and 76 and resistor structure 72. A subsequent silicidation process produces silicided and non-silicided sections such that the resistance across resistor structure 72 is indicative of which segments are silicided and not silicided, which, in turn, is indicative of the alignment or overlay of upper pattern 74 with respect to upper pattern 76.

Figure 5:
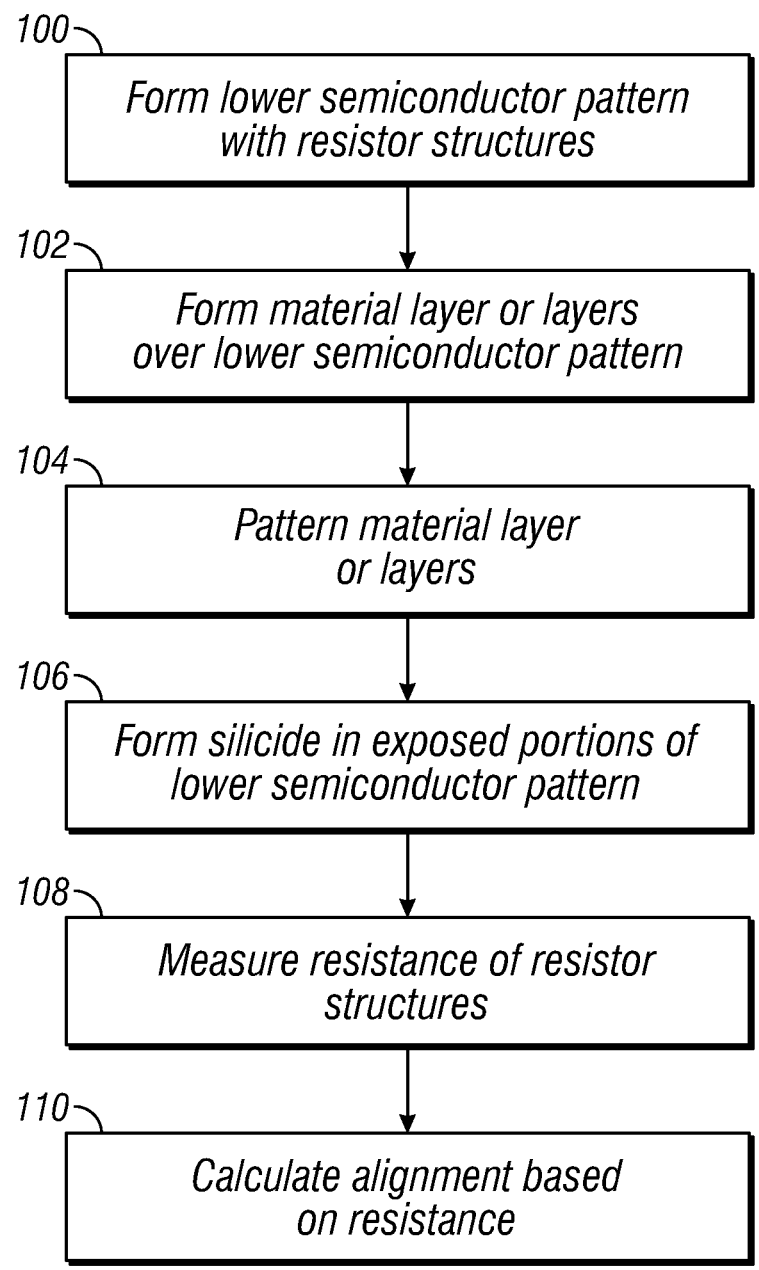
FIG. 5 is a flow chart illustrating an exemplary method of the disclosure.

FIG. 5 shows a flow chart of an exemplary method of the invention. At step 100, a lower semiconductor pattern is formed of semiconductor material in active portions of the semiconductor device and also in a test portion which includes a resistor structure or structures. There may be one resistor structure, a pair of resistor structures, or multiple pairs of resistor structures oriented to assess alignment in multiple directions. At step 102, a material layer or layers is formed over the lower semiconductor pattern and will advantageously include a lower dielectric layer over the lower semiconductor pattern. At step 104, the material layer or layers is patterned to form active device features in active device portions and also a pattern feature overlying the resistor structure or structures. At step 106, a silicide is formed in exposed portions of the lower semiconductor pattern including the resistor structures and at step 108, resistance of the resistor structure or structures is measured.

At step 110, alignment accuracy is assessed. As shown in FIGS. 1-3, the resistance of the resistor structure is dependent upon the amount of that resistor structure that has undergone silicidation and the amount of the resistor structure that has undergone silicidation is dependent upon the alignment of the overlying pattern of the material layer or layers. Because of the significant difference between sheet resistance in silicided and unsilicided portions, the overall resistance is very sensitive to the amount of the resistor structure or structures that has been silicided. When two resistor structures are presented in a pair such as shown in FIG. 1, the resistance difference between first resistor structure 2 and second resistor structure 4 is indicative of the relative position of upper pattern feature 40 along the y-direction in the illustrated orientation. According to one exemplary embodiment, perfectly accurate overlay, i.e. perfect alignment, will result in first resistor structure 2 and second resistor structure 4 having the same resistance. According to the embodiment in which a structure similar to the structure shown in FIG. 1 is formed in close proximity to the structure shown in FIG. 1 and rotated 90 degrees, multiple resistance measurements can be used to assess the alignment accuracy in both the x- and y-directions.

For each particular resistor structure or pairs of resistor structures, a correlation can be generated between the measured resistance and the number of segments such as transverse leads 10 and 26 (see FIG. 1) that have undergone silicidation based on the layout of the resistor structures. The number of such transverse leads that have undergone silicidation is directly dependent upon the location and therefore overlay between the upper pattern feature 40 and the lower resistor structures. The correlations may be based upon the resistor circuit diagrams such as shown in FIGS. 2 and 3 or other mathematical models. The measurements carried out at step 108 may be automatically carried out and may be carried out at multiple locations across a semiconductor substrate.

According to one aspect, provided is a test pattern structure in a semiconductor device for determining pattern overlay accuracy. The test pattern includes a lower semiconductor pattern of the semiconductor material bounded by a dielectric. The semiconductor pattern includes a first resistor structure and a second resistor structure. Each of the resistor structures includes a zigzag portion including transverse leads disposed orthogonal to a direction from the first resistor to the second resistor and each of the first resistor structure and second resistor structure include the transverse leads spaced at different distances from the other of the resistor structures.

According to another aspect, provided is a method for determining overlay accuracy in a semiconductor device. The method comprises forming a lower semiconductor pattern of a semiconductor material bounded by a dielectric, the lower semiconductor pattern including a first resistor structure and a second resistor structure, forming an overlying pattern in a material layer or layers over the semiconductor pattern, siliciding exposed portions of the first resistor structure and second resistor structure, not covered by the overlaying pattern, measuring a first resistance of the first resistor structure and measuring a second resistance of the second resistor structure, and calculating overlay accuracy between the overlying pattern and the lower semiconductor pattern based on the first resistance and second resistance.

According to another aspect, the disclosure provides a method for determining overlay accuracy in a semiconductor device. The method comprises forming a lower semiconductor pattern of a semiconductor material bounded by a dielectric, the lower semiconductor pattern including at least a resistor structure, forming a first overlying pattern in a first material layer or layers over the semiconductor pattern, forming a second overlying pattern in the second material layer or layers over the semiconductor pattern and siliciding exposed portions of the lower semiconductor pattern not covered by the first overlying pattern or the second overlying pattern. The method further includes measuring resistance of the resistor structure and calculating alignment accuracy between the first overlying pattern and the second overlying pattern based on resistance.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A test pattern structure in a semiconductor device for determining pattern overlay accuracy, comprising:
  a semiconductor pattern of a semiconductor material bounded by a dielectric, said semiconductor pattern including a first resistor structure and a second resistor structure;
  each of said first resistor structure and said second resistor structure including a zigzag portion including transverse leads, wherein said transverse leads include first transverse leads of said first resistor structure and second transverse leads of said second resistor structure, said first transverse leads parallel to said second transverse leads and said first resistor structure comprising first parallel leads orthogonal to said first transverse leads and said second resistor structure including second parallel leads orthogonal to said second transverse leads and parallel to said first parallel leads.

2. The test pattern structure as in claim 1, further comprising a further pattern formed in a material layer over said semiconductor pattern, and wherein portions of said semiconductor pattern not covered by said further pattern include a silicide on an upper surface thereof.

3. The test pattern structure as in claim 2, wherein said first resistor structure and said second resistor structure are test structures formed in a test portion on a semiconductor substrate and said semiconductor pattern further includes active semiconductor device features in active portions of semiconductor devices formed on said semiconductor substrate, and further comprising said further pattern being part of a larger device pattern also formed within said active portions of semiconductor devices.

4. The test pattern structure as in claim 1, wherein said first and second parallel leads each has different lengths, said first parallel leads coupled to one another by said first transverse leads, said second parallel leads coupled to one another by said second transverse leads.

5. The test pattern structure as in claim 4, wherein longer ones of said parallel leads of said first resistor structure extend closer to said second resistor structure than shorter ones of said parallel leads of said first resistor structure.

6. The test pattern structure as in claim 5, wherein, for each of said first and second resistor structures, each said parallel lead includes one end that terminates at the same perpendicular location and an opposed end joined to an adjacent one of said parallel leads by one said transverse lead, said opposed ends and said transverse leads forming a step-like structure in each of said first and second resistor structures, and wherein said first resistor includes said parallel leads having respective lengths that increase progressively along a first orthogonal direction and said second resistor includes said parallel leads having respective lengths that decrease progressively along said first orthogonal direction.

7. The test pattern structure as in claim 1, wherein said semiconductor pattern further comprises a third resistor structure and a fourth resistor structure, each of said third and fourth resistor structures including an associated zigzag portion with further transverse leads disposed orthogonal to a direction from said third resistor structure to said fourth resistor structure, said third resistor structure including said further transverse leads spaced at different distances from said fourth resistor structure and said fourth resistor structure including said further transverse leads spaced at different distances from said third resistor structure, said transverse leads and said further transverse leads being substantially orthogonal to one another.

8. A test pattern structure for determining overlay accuracy in a semiconductor device, said test pattern structure comprising:

a lower semiconductor pattern of a silicon material bounded laterally by a dielectric, said lower semiconductor pattern including at least a resistor structure;

a first overlying pattern in a first material layer or layers, disposed over said semiconductor pattern;

a second overlying pattern in a second material layer or layers, disposed over said semiconductor pattern;

wherein exposed portions of said lower semiconductor pattern not covered by said first overlying pattern or said second overlying pattern comprise a gap between boundaries of said first overlying pattern and said second overlying pattern, and wherein said lower semiconductor pattern includes said resistor structure and a further resistor structure, each having a plurality of parallel leads that are coupled to one another by orthogonal leads, the parallel leads having different lengths.

9. The test pattern structure as in claim 8, wherein said lower semiconductor pattern includes said resistor structure and a further resistor structure in a test portion of a semiconductor device and further comprising active device structures in an active device portion of said semiconductor device, on a semiconductor substrate, and wherein at least one of said first and second overlying patterns includes a portion in said test portion and a further portion in said active device portion of said semiconductor device.

10. The test pattern structure as in claim 8, wherein said resistor structure comprises a polysilicon pattern.

11. The test pattern structure as in claim 8, wherein said parallel leads of said resistor structure are parallel to said parallel leads of said further resistor structure, longer ones of said parallel leads of said resistor structure extend closer to said further resistor structure than shorter ones of said parallel leads of said resistor structure, and said resistor structure includes said parallel leads having respective lengths that increase progressively along a first orthogonal direction and said further resistor structure includes said parallel leads having respective lengths that decrease progressively along said first orthogonal direction.

12. A test pattern structure for determining overlay accuracy in a semiconductor device, said test pattern structure comprising:

a lower semiconductor pattern of a semiconductor material bounded by a dielectric, said lower semiconductor pattern including a first resistor structure and a second resistor structure;

an overlying pattern in a material layer or layers, disposed over said lower semiconductor pattern;

wherein each of said first resistor structure and said second resistor structure comprises a zig-zag portion including transverse leads, wherein said transverse leads include first transverse leads of said first resistor structure and second transverse leads of said second resistor structure, said first transverse leads parallel to said second transverse leads and said first resistor structure comprising first parallel leads orthogonal to said first transverse leads and said second resistor structure including second parallel leads orthogonal to said second transverse leads and parallel to said first parallel leads.

13. The test pattern structure as in claim 12, wherein portions of said lower semiconductor pattern not covered by said overlying pattern include a silicide on an upper surface thereof.

14. The test pattern structure as in claim 12, wherein said first and second parallel leads each has different lengths, said first parallel leads coupled to one another by said first transverse leads, said second parallel leads coupled to one another by said second transverse leads.

15. The test pattern structure as in claim 14, wherein longer ones of said parallel leads of said first resistor structure extend closer to said second resistor structure than shorter ones of said parallel leads of said first resistor structure.

16. The test pattern structure as in claim 12, wherein said overlying pattern comprises a first overlying pattern and further comprising a second overlying pattern in a second material layer or layers disposed over said lower semiconductor pattern, and wherein exposed portions of said lower semiconductor pattern not covered by said overlying pattern or said second overlying pattern comprise a gap between boundaries of said first overlying pattern and said second overlying pattern said forming an overlying pattern includes forming portions in said at least one test portion and in an active device portion of said semiconductor device.

\* \* \* \* \*